(12) United States Patent
Noguchi

(10) Patent No.: US 6,393,603 B1
(45) Date of Patent: May 21, 2002

(54) CIRCUIT DESIGN METHOD CALCULATING ANTENNA SIZE OF CONDUCTIVE MEMBER CONNECTED TO GATE OXIDE FILM OF TRANSISTOR WITH APPROXIMATE EXPRESSION

(75) Inventor: Ko Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/455,237

(22) Filed: Dec. 6, 1999

(30) Foreign Application Priority Data

Dec. 10, 1998 (JP) ............................................. 10-351635

(51) Int. Cl.[7] ......................... G06F 17/50; H01L 21/82; H01L 27/04; H01L 23/62
(52) U.S. Cl. .......................... 716/10; 257/359; 257/360; 257/491; 216/67; 326/9; 326/47; 326/48; 326/50; 326/103
(58) Field of Search ..................... 716/1–21; 257/1–930; 326/9–15, 47–50, 61, 101–103

(56) References Cited

U.S. PATENT DOCUMENTS

| | | | | |
|---|---|---|---|---|
| 5,494,522 A | * | 2/1996 | Moriya et al. | 118/719 |
| 5,717,294 A | * | 2/1998 | Sakai et al. | 118/723 MR |
| 5,744,012 A | * | 4/1998 | Park | 204/192.34 |

(List continued on next page.)

FOREIGN PATENT DOCUMENTS

| | | | | |
|---|---|---|---|---|
| JP | 406061440 A | * | 3/1994 | ............ H01L/27/92 |
| JP | 61440/1994 | | 3/1994 | ............ H01L/27/92 |
| JP | 8-97416 | | 4/1996 | ............ H01L/29/78 |
| JP | 9-64345 | | 3/1997 | ............ H01L/29/78 |
| JP | 9-139459 | | 5/1997 | ............ H01L/23/60 |
| JP | 409199606 A | * | 7/1997 | ....... H01L/21/8234 |
| JP | 283753/1997 | | 10/1997 | ............ H01L/29/78 |

OTHER PUBLICATIONS

Chang et al., "Degradation of MOS transistor characteristics by gate charging damage during processing", 1993 International Symposium on VLSI Technology, Systems, and Applications, May 12, 1993, pp. 320–324.*

Chen et al., "Reverse antenna effect due to process–induced quasi–breakdown of gate oxide", IEEE International Integrated Reliability Workshop, Oct. 20, 1996, pp. 94–97.*

Lee et al., "The electrostatic charging damage on the characteristics and reliability of polysilicon thin–film transistors during plasma hydrogenation", IEEE Electron Device Letters, vol. 18, No. 5, May 1997, pp. 187–189.*

Brozek et al., "Effect of device type and plasma process on the oxide thickness dependence of plasma–induced charging damage", 1998 3rd International Symposium on Plasma Process–Induced Damage, Jun. 4, 1988, pp. 46–49.*

Park et al., "Stress–induced leakage current due to charging damage: gate oxide thickness and gate poly–Si etching condition dependence", 1998 $3^{rd}$ International Symposium on Plasma Process–Induced Damage, Jun. 4, 1998, pp. 56–59.*

Siu et al., "Measurement of plasma parameters and electron shading effects using patterned and unpatterned SPORT wafers", 1998 $3^{rd}$ International Symposium on Plasma Process–Induced Damage, Jun. 4, 1998, pp. 136–139.*

(List continued on next page.)

Primary Examiner—Matthew Smith
Assistant Examiner—Phallaka Kik
(74) Attorney, Agent, or Firm—Scully, Scott, Murphy & Presser

(57) ABSTRACT

Antenna size of conductive members is calculated with respect to an area of a gate oxide film of a transistor using an expression which approximates an actual relationship of changes therein, not using a simple proportional relationship. As a result, in design of a structure having conductive members connected to a gate oxide film of a transistor, it is possible to properly calculate an antenna size such as wire length of the conductive members with respect to an area of the gate oxide film.

14 Claims, 5 Drawing Sheets

U.S. PATENT DOCUMENTS

| | | | | |
|---|---|---|---|---|
| 5,744,838 A | * | 4/1998 | Matsuo et al. | 257/355 |
| 5,815,366 A | * | 9/1998 | Morita et al. | 279/128 |
| 5,828,119 A | * | 10/1998 | Kasube | 257/491 |
| 5,846,885 A | * | 12/1998 | Kamata et al. | 216/67 |
| 5,852,317 A | | 12/1998 | Berman | 257/390 |
| 5,903,031 A | * | 5/1999 | Yamada et al. | 257/356 |
| 5,955,764 A | * | 9/1999 | Katsube | 257/203 |
| 6,037,599 A | * | 3/2000 | Takase et al. | 250/251 |
| 6,075,292 A | * | 6/2000 | Noguchi | 257/750 |
| 6,091,114 A | * | 7/2000 | Mogul et al. | 257/360 |

OTHER PUBLICATIONS

Alba et al., "Correlation between plasma–induced gate oxide damage and charging sensor measurements", 1998 $3^{rd}$ International Symposium on Plasma Process–Induced Damage, Jun. 4, 1998, pp. 140–143.*

"Gate Oxide Charging and its Elimination for Metal Antenna Capacitor and Transistor in VLSI CMOS Double Layer Metal Technology", F. Shone, et al, 1989 Symposium on VLSI Technology. Digest of Technical Papers, published 1989, business Center for Acad. Doc. Japan, pp. 73–74.

"Process Induced Charging Damage in Thin Gate Oxides", by G. Bersuker, et al, 1997 2nd International Symposium on Plasma Process induced Damage, published 1997, American Vacuum Soc, pp. 21–24.

"A Comparison Between Plasma Charging–Damage and Inductive–Damage: Damage Response to Fowler–Nordhein Stress", A. Salah, et al., Solid State Electronics, vol. 39, No. 12, pp. 1701–1707, 1996.

"Implant Damage Evaluation Using Spider" J. Mitros, et al., 1994 International Integrated Reliability Workshop, published 1994, IEEE, pp. 104–105.

"New Phenomena of Charge Damage in Plasma Etching: Heavy Damage Only Through Dense–Line Antenna", K. Hashimoto, Japanese Journal of Applied Physics, Part I, vol. 32 No. 12B, pp. 6109–6113, Dec. 1993.

* cited by examiner

CIRCUIT DESIGN METHOD CALCULATING ANTENNA SIZE OF CONDUCTIVE MEMBER CONNECTED TO GATE OXIDE FILM OF TRANSISTOR WITH APPROXIMATE EXPRESSION

BACKGROUND OF THE INVENTION

1. Field of the Invention

The present invention relates to design of an integrated circuit device, and more particularly to a method and an apparatus for designing an integrated circuit device which comprises a transistor having a gate oxide film connected to conductive members.

2. Description of the Related Art

Presently, various integrated circuit devices are utilized in various electronic equipment. Such integrated circuit devices typically have various circuit components formed with a thin film technique. Such circuit components formed in an integrated circuit device with a thin film technique include a transistor whose gate oxide film may be connected to conductive members.

For example, in integrated circuit device 1 in the process of fabrication illustrated in FIG. 1, transistor 2 has gate oxide film 3 connected to gate electrode 4 and metal wire 5 as conductive members, and metal wire 5 is disposed on an upper surface of insulating layer 6 which is an insulating member. Photoresist 7 which is an insulating member is temporarily stacked as a mask on an surface of metal wire 5. Metal wire 5 is processed with anisotropic etching using plasma with photoresist 7 as a mask.

In integrated circuit device 1 in the aforementioned state, side surfaces of metal wire 5 are exposed to plasma and may be subjected to charge in the plasma at the anisotropic etching of metal wire 5. Since the charge entered by metal wire 5 flows from gate electrode 4 to semiconductor substrate 8 through gate oxide film 3, gate oxide film 3 may be damaged.

The presence or absence of the damage results from the density of the charge flowing through gate oxide film 3, and the charge density results from the intensity of the plasma, the area of gate oxide film 3 and the antenna size of metal wire 5. In other words, if the intensity of plasma used in the fabrication process is known, design may be performed only in consideration of the area of gate oxide film 3 and the antenna size of metal wire 5.

Thus, conventionally, a maximum antenna size M1 of conductive members allowed with respect to a reference area S1 of a gate oxide film is defined, and the ratio of the two is represented as an antenna ratio R, as follows:

$$R = M1/S1$$

When a gate oxide film with an area S2 is newly formed, an antenna size M2 of conductive members connected thereto can prevent damage to the gate oxide film if it is set as follows:

$$M2 \leq R \times S2$$

It should be noted that the antenna size of conductive members refers to the size of portions of the conductive members which serve as an antenna, for example the area of exposed portions of the metal wire as described above. However, when a reference metal wire and a new metal wire have the same film thickness, the antenna size can be approximated by the area of an upper surface of the metal wire if only the upper surface of the metal wire is exposed, while the antenna size can be approximated by the entire periphery of the metal wire if only side surfaces thereof are exposed.

When a structure having conductive members connected to a gate oxide film is formed, any charge in plasma entered by the conductive members does not damage the gate oxide film if the relationship of an area S of the gate oxide film and an antenna size M of the conductive members to an antenna ratio R satisfies the following expression:

$$M \leq R \times S$$

However, when a maximum antenna size M1 of conductive members allowed with respect to a reference area S1 of a gate oxide film is specified, the specified ratio used as an antenna ratio R for calculating a maximum antenna size M2 with respect to a new area S2 revealed that the resulting antenna size M2 is inappropriate.

For example, assuming that a new area S2 being a double reference area S1, a new maximum antenna size M2 is also a double reference maximum antenna size M1 in the conventional approach. Actually, however, experiments show that the antenna size M2 more than doubles the antenna size M1 is allowed.

Additionally, assuming that a new area S2 is a half of a reference area S1, a new maximum antenna size M2 is also a half of a reference maximum antenna size M1 in the conventional approach. Actually, however, it has been shown that the antenna size M2 needs to be smaller than a half of the antenna size M1.

Specifically, changes in antenna size M of conductive members have been conventionally considered to be directly proportional to changes in area S of a gate oxide film at a certain antenna ratio R, which proved not to fit the actual conditions. As a result, the conventional approach can not form conductive members in a proper shape, thereby making it difficult to optimize integrated circuit devices.

SUMMARY OF THE INVENTION

It is an object of the present invention to provide a circuit design method and apparatus for optimally designing an integrated circuit device.

It is another object of the present invention to provide an information storage medium for storing a program for optimally designing an integrated circuit device.

It is further object of the present invention to provide an integrated circuit device in which conductive members connected to a gate oxide film of a transistor are formed in a proper shape.

A conventional circuit design method to which the present invention is applied is for designing an integrated circuit device having a transistor with a gate oxide film connected to conductive members wherein a maximum antenna size M1 of the conductive members allowed with respect to a reference area S1 of the gate oxide film is defined.

In a first aspect of the circuit design method of the present invention, when a gate oxide film having an area S2 larger than the area S1 is newly designed, a maximum antenna size M2 of new conductive members allowed with respect to the area S2 is set as follows:

$$M2 > M1 \times (S2/S1).$$

When a gate oxide film having an area S2 smaller than the area S1 is newly designed, a maximum antenna size M2 of new conductive members allowed with respect to the area S2 is set as follows:

$$M2 < M1 \times (S2/S1).$$

In a second aspect of the circuit design method of the present invention, an area S2 of a new gate oxide film and a maximum antenna size M2 of new conductive members are set to satisfy the following relationship:

$$M2 = M1 \times (S2/S1)^{1/b}$$

where b is a predetermined constant.

In a third aspect of the circuit design method of the present invention, an area S2 of a new gate oxide film and a maximum antenna size M2 of new conductive members are set to satisfy the following relationship:

$$M2 = d \times (M1/d)^{(S2/S1)}$$

where d is a predetermined constant.

In the aforementioned circuit design method, the constant b may satisfy $0.5 \leq b \leq 0.8$.

In the aforementioned circuit design method, the constant d may satisfy $0.5 \leq d \leq 3.0$.

In a first aspect of a circuit design apparatus of the present invention, data storage means stores an allowed maximum antenna size M1 of conductive members and a reference area S1 of a gate oxide film, and upon data input of an area S2 of a new gate oxide film to data input means, calculation means calculates a maximum antenna size M2 of new conductive members allowed with respect to the input area S2 as follows:

$$M2 = M1 \times (S2/S1)^{1/b}$$

where b is a predetermined constant.

In a second aspect of the circuit design apparatus of the present invention, data storage means stores an allowed maximum antenna size M1 of conductive members and a reference area S1 of a gate oxide film, and upon data input of an area S2 of a new gate oxide film to data input means, calculation means calculates a maximum antenna size M2 of new conductive members allowed with respect to the input area S2 as follows:

$$M2 = d \times (M1/d)^{(S2/S1)}$$

where d is a predetermined constant.

An information storage medium of the present invention stores programs for causing a computer to perform processing in the circuit design method of the present invention. An integrated circuit device of the present invention is designed with the circuit design method of the present invention.

As described above, experiments show that changes in antenna size M of conductive members are not proportional to changes in area S of a gate oxide film. A relationship between antenna sizes M and charge amounts Q flowing into a gate oxide film, which are obtained as the experiment results, is plotted as FIG. 5.

Since the degree of damage to a gate oxide film is defined with the proportion of the area S to the charge amount Q, mathematization of curves in FIG. 5 obtained from the experiment results means mathematization of a relationship between the area S of a gate oxide film and the antenna size M of conductive members. Thus, consideration was given to expressions representing curves which approximate the experiment results and revealed that curves represented by the following two expressions approximate the experiment results:

$$Q = aM^b \ (a, b \text{ are predetermined constants}) \quad (1)$$

$$Q = c \ \log(M/d) \ (c, d \text{ are predetermined constants}) \quad (2)$$

When a maximum antenna size M1 of conductive members allowed with respect to a reference area S1 of a gate oxide film is defined, a charge amount Q2 allowed by a gate oxide film with an area S2 satisfies the following relationship assuming that a charge amount allowed by a gate oxide film with an area S1 is Q1:

$$Q1/S1 = Q2/S2 \quad (3)$$

Substitution of the expression (1) into the expression (3) yields the following:

$$aM1^b/S1 = aM2^b/S2 \quad (4)$$

and when the expression is simplified, the following is obtained:

$$M2 = M1 \times (S2/S1)^{1/b} \quad (5)$$

Substitution of the expression (2) into the expression (3) yields the following:

$$c \ \log(M1/d)/S1 = c \ \log(M2/d)/S2 \quad (6)$$

and when the expression is simplified, the following is obtained:

$$M2 = d \times (M1/d)^{(S2/S1)}.$$

Specifically, when a maximum antenna size M1 of conductive members allowed with respect to a reference area S1 of a gate oxide film is defined, an antenna size of conductive members is proper if an area S2 of a new gate oxide film and a maximum antenna size M2 of new conductive members satisfy the following relationship:

$$M2 = M1 \times (S2/S1)^{1/b}$$

where b is a predetermined constant, or the following relationship:

$$M2 = d \times (M1/d)^{(S2/S1)}$$

where d is a predetermined constant.

In other words, in the present invention, an antenna size of conductive members is calculated with respect to a gate oxide film of a transistor using expressions which approximate an actual relationship of changes therein. As a result, it is possible to properly acquire an antenna size of conductive members connectable to a gate oxide film of a transistor, thereby enabling optimal design and fabrication of an integrated circuit device. Additionally, since design of an integrated circuit device need not be changed unnecessarily, an integrated circuit of optimal structure can be designed with favorable efficiency.

It should be noted that the constants b and d reflect the proportion of damage to the antenna size of conductive members. The constant b preferably satisfies, for example, "$0.5 \leq b \leq 0.8$", and can be set to approximately 0.64.

The constant d preferably satisfies "$0.5 \leq d \leq 3.0$", and can be set to approximately 1.39.

Various means in the present invention may be formed in any way to realize their functions, and for example, dedicated hardware, computers provided with proper functions by programs, functions realized within computers by proper programs, or a combination thereof is allowed.

The antenna size of conductive members in the present invention refers to the size of portions of the conductive members which serve as an antenna, for example the area of exposed portions of a metal wire. However, when a reference metal wire and a new metal wire have the same film thickness, the antenna size can be approximated by the area of an upper surface of the metal wire if only the upper surface of the metal wire is exposed, while the antenna size can be approximated by the entire periphery of the metal wire if only side surfaces thereof are exposed.

The information storage medium in the present invention may be any medium which previously stores programs as software for causing computers to perform various processing, and for example, ROMs (Read Only Memory) or HDDs (Hard Disc Drive) fixed in a device having a computer as a portion thereof, CD (Compact Disk)-ROMs or FDs (Floppy Disk) loaded removably on a device having a computer as a portion thereof, or the like is allowed.

The computer in the present invention may be any device as long as it can read programs comprising software to perform processing which corresponds thereto, and for example, an apparatus having a CPU (Central Processing Unit) as a main unit and various devices such as ROM, RAM, I/F (interface) or the like connected thereto as required is allowed.

The above and other object, features and advantages of the present invention will become apparent from the following description with reference to the accompanying drawings which illustrate examples of the present invention.

DETAILED DESCRIPTION OF THE EMBODIMENTS

Figure 3:
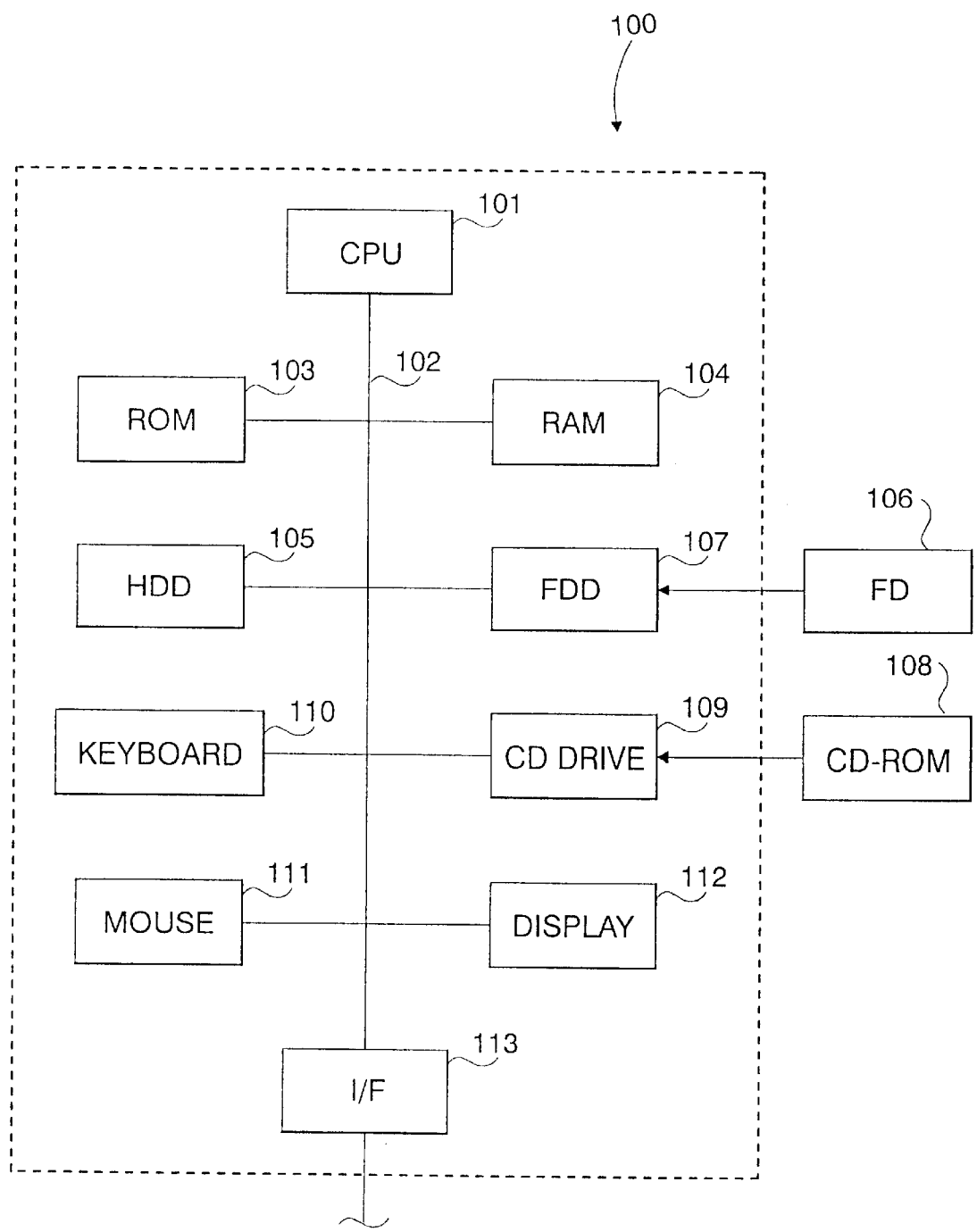
FIG. 3 is a block diagram showing a physical structure.

Referring to FIG. 3, there is shown data processing apparatus 100 which is an embodiment of a circuit design apparatus of the present invention, comprising CPU 101 as hardware serving as a main unit of a computer. CPU 101 is connected through bus line 102 to ROM 103, RAM 104, HDD 105, FDD (FD Drive) 107 loaded with FD 106, CD drive 109 loaded with CD-ROM 108, keyboard 110, mouse 111, display 112, and communication I/F 113.

In data processing apparatus 100 of the embodiment, ROM 103, RAM 104, HDD 105, FD 106, and CD-ROM 108 correspond to information storage media in which programs and data required for various operations are stored as software.

Since data processing apparatus 100 of the present invention is used for design of an integrated circuit apparatus comprising a transistor having a gate oxide film connected to conductive members, control programs for causing CPU 101 to perform various processing operations therefor are previously stored in FD 106 or CD-ROM 108.

Figure 1:
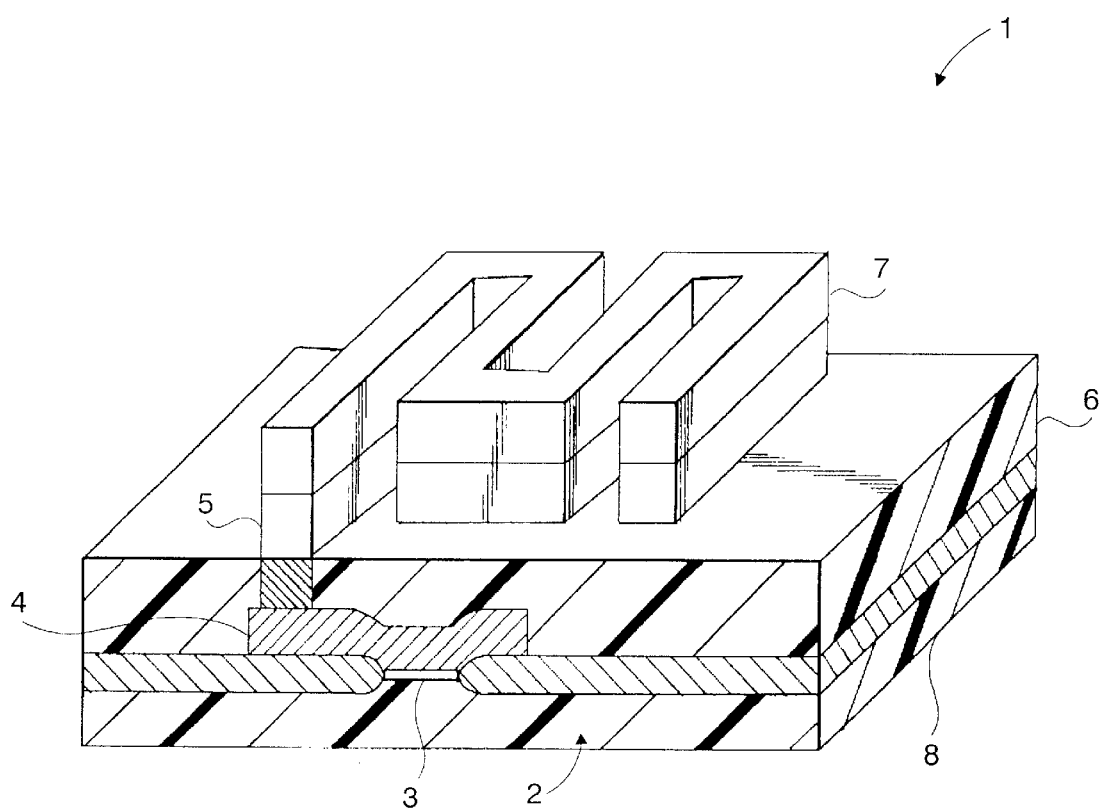
FIG. 1 is a perspective view showing main portions of an integrated circuit device in the process of fabrication.
Figure 2:
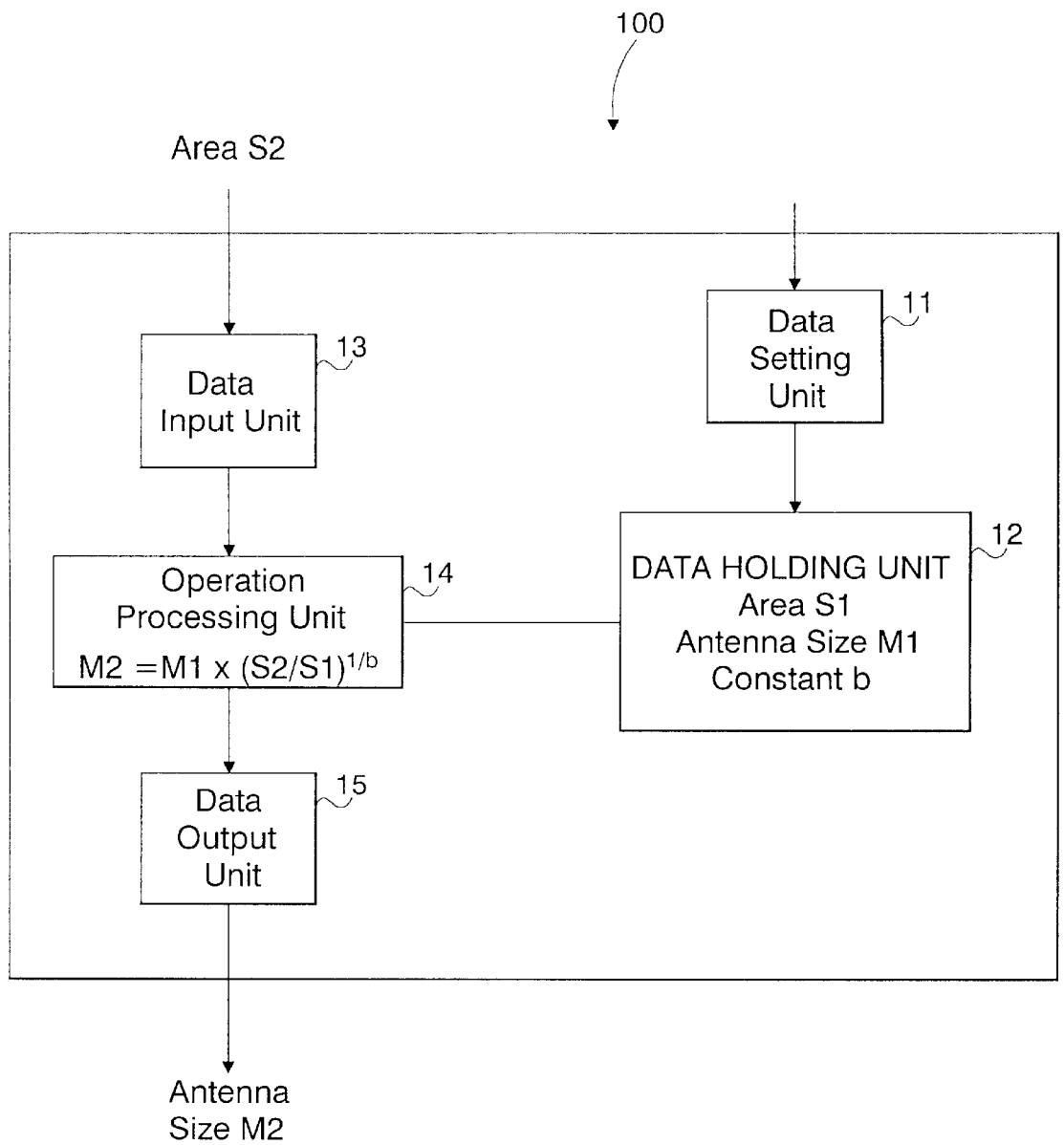
FIG. 2 is a schematic diagram showing a logical structure of a data processing apparatus which is one embodiment of a circuit design apparatus of the present invention.

Such software is preinstalled in HDD 105 and copied to RAM 104 at the startup of data processing apparatus 100 and then read by CPU 101. In this way, CPU 101 reads proper programs to perform various processing operations, thereby logically realizing data setting unit 11, data storage unit 12, data input unit 13, operation processing unit 14, and data output unit 15 in data processing apparatus 100 of the embodiment as shown in FIG. 2.

Data setting unit 11 receives external inputs of parameters by a user such as a reference area S1 of a gate oxide film of a transistor, a maximum antenna size M1 of conductive members allowed with respect to the S1, and a predetermined constant b, by CPU 101 entering input data through keyboard 110 corresponding to the control program stored in RAM 104.

Data storage unit 12 corresponds to a predetermined storage area of RAM 104 recognized by CPU 101, and stores the externally input parameters to data setting unit 11 such as the area S1, the antenna size M1 and the constant b.

Data input unit 13 receives from a user an external input of an area S2 of a new gate oxide film serving as a parameter by CPU 101 entering input data through keyboard 110 corresponding to the control program stored in RAM 104.

Operation processing unit 14 reads parameters such as the area S1, the antenna size M1 and the constant b from data storage unit 12 upon data input of the area S2 to data input unit 13 and calculates a maximum antenna size M2 of new conductive members allowed with respect to the area S2 as "$M2=M1\times(S2/S1)^{1/b}$" by CPU 101 performing predetermined processing operations corresponding to the control program stored in RAM 104.

Data output unit 15 outputs the antenna size M2 calculated by operation processing unit 14 to an external user by CPU 101 controlling data output with display 112 corresponding to the control program stored in RAM 104.

While respective units 11 to 15 as described above are realized using hardware such as keyboard 110 and display 112 as required, the main portions thereof are realized by CPU 101, which is a computer comprising hardware, operating corresponding to software stored in an information storage medium such as RAM 104.

Such software is stored in an information storage medium such as RAM 104 as a control program for causing CPU 101 to perform processing operations, for example, entering data input such as a reference area S1, a reference antenna size M1 and a predetermined constant b; storing the various parameters input as data; entering data input of a new area S2; calculating a maximum antenna size M2 of a new conductive member allowed with respect to the input area S2 as "$M2=M1\times(S2/S1)^{1/b}$"; and outputting the calculated antenna size M2 as data.

In the aforementioned configuration, data processing apparatus 100 of the embodiment is used for design of an integrated circuit device having a transistor with a gate oxide film connected to conductive members, and properly calculates a maximum antenna size of conductive members connectable to a gate oxide film of a newly designed transistor.

In this case, data processing apparatus 100 requests a user to set data for a reference area S1 of a gate oxide film of a transistor, a maximum antenna size M1 of conductive members allowed with respect to the S1 and a predetermined constant b, with display of a guidance message on display 112 or the like as a preparatory operation prior to circuit design.

When a user inputs proper parameters with manipulation of keyboard 110 as desired, the input parameters are set as data in RAM 104. Upon completion of such data setting, data processing apparatus 100 is in a state where it can perform circuit design and requests a user to externally input an area S2 of a new gate oxide film with display of a guidance message on display 112 or the like.

Figure 4:
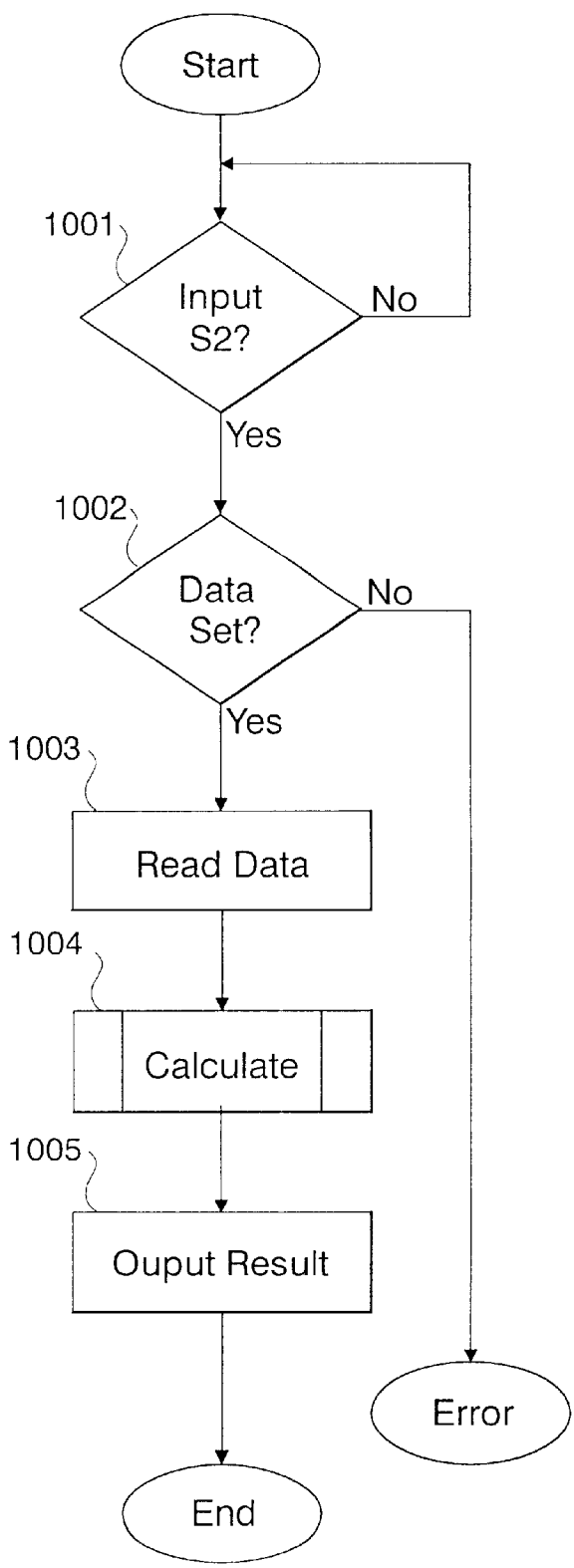
FIG. 4 is a flow chart showing a circuit design method of the embodiment.

As shown at 1001 in FIG. 4, a user inputs a desired area S2 through manipulation of keyboard 110, and then whether data setting of the reference area S1 and the like has been performed is checked at 1002. After the check, at 1003, parameters such as the S1, the antenna size M1 and the constant b are read from RAM 104. At 1004, a maximum antenna size M2 of new conductive members allowed with respect to the area S2 is calculated as "$M2=M1\times(S2/S1)^{1/b}$".

The antenna size M2 calculated in this manner is provided to the user with display processing on display 112 or the like at 1005, thereby allowing the user to obtain the maximum antenna size M2 of conductive members connectable to the new gate oxide film designed as having the area S2.

In other words, when an integrated circuit device is newly designed, an antenna size of conductive members connectable to a gate oxide film of a transistor thereof is properly obtained. As a result, it is possible to optimally design an integrated circuit device and to fabricate an integrated circuit device whose respective portions are optimized.

Since an integrated circuit device designed and fabricated in this manner has conductive members of a proper antenna size connected to a gate oxide film of a transistor in the process of fabrication, incoming charge due to plasma causes no damage to the gate oxide film. Moreover, since the antenna size of conductive members need not be reduced unnecessarily, the design of the integrated circuit device need not be changed needlessly, thereby making it possible to design an integrated circuit device of optimal configuration with favorable efficiency.

In a data processing method with data processing apparatus 100 of the embodiment, if a reference area S1 of a gate oxide film, a reference antenna size M1 of conductive members and a proper constant b have been preset as described above, a new antenna size M2 is properly calculated with respect to a new area S2.

When a new antenna size M2 is calculated on the basis of areas S1, S2 and an antenna size M1, conventionally, the new antenna size has been simply calculated with the proportion of the areas as "$M2=M1\times(S2/S1)$". However, as shown in FIG. 5, experiments show that changes in antenna size M of conductive members are actually not proportional to changes in area S of a gate oxide film.

Figure 5:
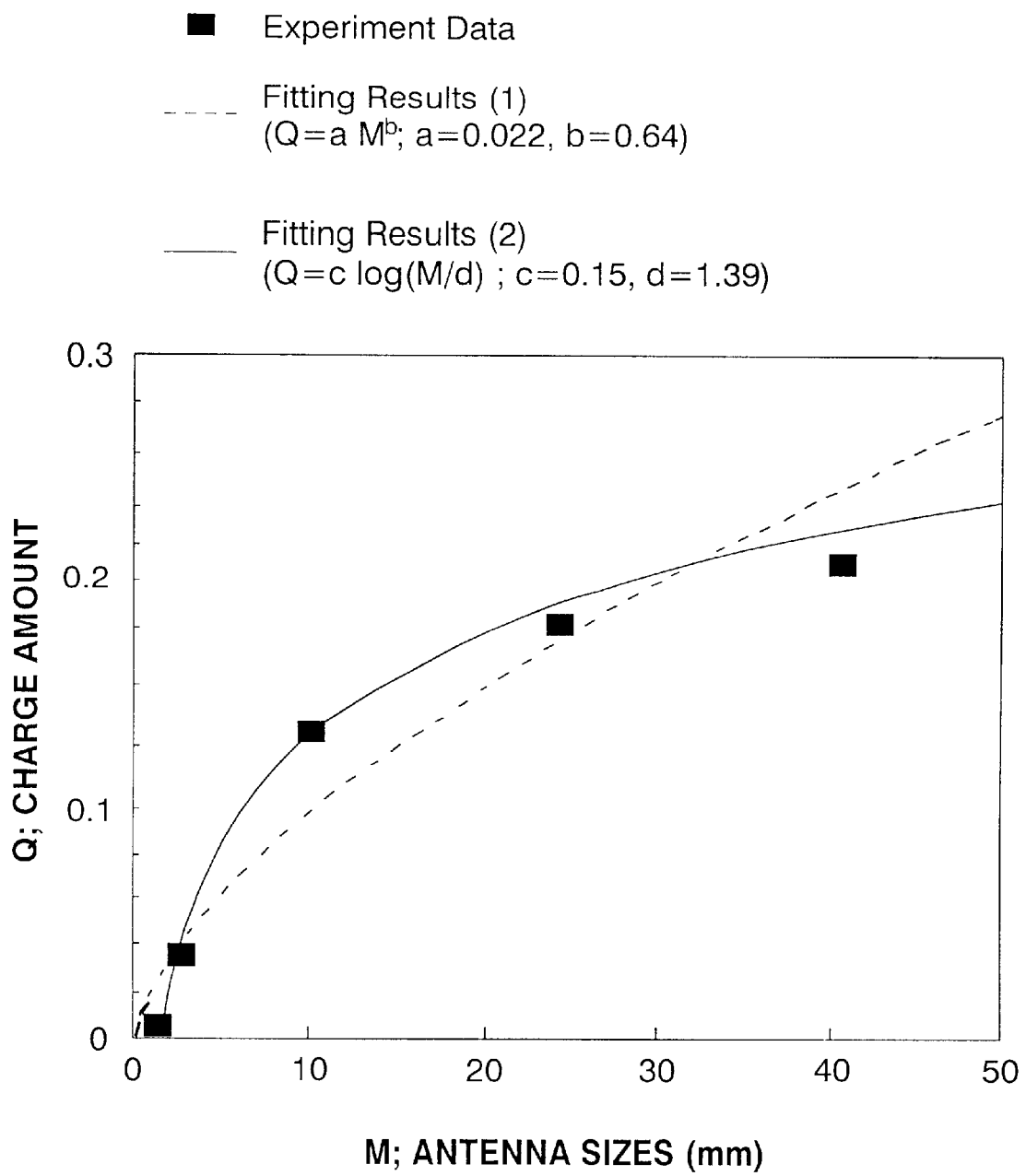
FIG. 5 is a characteristic diagram showing a relationship between a wire length which is an example of an antenna size M of conductive members and a charge amount Q flowing into a gate oxide film due to plasma.

In view of this, in the data processing method with data processing apparatus 100 of the embodiment, as shown with a broken line in FIG. 5, an expression is set as "$M2=M1\times(S2/S1)^{1/b}$", for favorably approximating a relationship of changes in actual area S and antenna size M. This expression enables proper calculation of a new antenna size M2.

The constant b reflects the proportion of damage to the antenna size of conductive members, and can be set to a numerical value which satisfies, for example, "$0.5 \leq b \leq 0.8$", and for example, set to be "$b=0.64$".

However, the value varies depending on various conditions such as a film thickness of conductive members, materials of conductive members, or a state of plasma to be used. For this reason, in data processing apparatus 100 of the embodiment, the constant b is managed as a parameter which can be set by a user as desired together with the reference area S1 and the antenna size M1, and the new antenna size M can be properly calculated even when conditions for fabricating an integrated circuit device are changed.

It should be noted that although the aforementioned embodiment uses "$M2=M1\times(S2/S1)^{1/b}$" as an example of an expression for approximating a relationship of actual changes in area S of a gate oxide film and antenna size M of conductive members, an expression "$M2=d\times(M1/d)^{(S2/S1)}$" (d represents a predetermined constant) may be used for calculation.

In this case, as shown with a solid line in FIG. 5, it is possible to more favorably reflect actual characteristics and to more properly calculate an antenna size M. Since this constant d also reflects the proportion of damage to an antenna size of conductive members, it preferably satisfies, for example, "$0.5 \leq d \leq 3.0$", and it can be set to 1.39.

The aforementioned first expression "$M2=M1\times(S2/S1)^{1/b}$" has a simple content and is easy to calculate, while the aforementioned second expression "$M2=d\times(M1/d)^{(S2/S1)}$" can favorably reflect actual characteristics. In other words, they have both an advantage and a disadvantage, and actually it is preferable to select one of them in consideration of accuracy required for design or performance of devices used in design.

The aforementioned embodiment shows an example of data processing apparatus 100 used for designing a new circuit in which a new area S2 is input as data to calculate a new antenna size M2 in a state where a reference area S1, an antenna size M1 and a constant b have been set as data.

However, data processing apparatus 100 as described above may be utilized for verifying propriety of an integrated circuit device for which circuit design has been performed. In this case, design data of an integrated circuit device for which circuit design has been performed is also set as data in a state where a reference area S1, an antenna size M1 and a constant b have been set in data processing apparatus 100.

Data processing apparatus 100 searches for design data of a transistor to acquire an area S2 of a gate oxide film thereof and an antenna size M2 of conductive members connected thereto. Then, calculation is made to check whether a relationship between the area S2 and the antenna size M2 falls within an allowable range as described above, thereby detecting design portions with an area S2 and an antenna size M2 out of the allowable range and in need of correction.

Additionally, the aforementioned embodiment shows an example of various means logically realized in data processing apparatus 100 by CPU 101 operating in accordance with the control program stored in RAM 104 as software. However, each of various means can be formed as a unique hardware, or some of them can be stored in RAM 104 as software and others can be formed as hardware.

The aforementioned embodiment assumes that the software preinstalled from CD-ROM 108 to HDD 105 is copied to RAM 104 at the startup of data processing apparatus 100, and the software thus stored in ROM 104 is read by CPU 101. However, such software may be utilized by CPU 101 while it is stored in HDD 105, or it may be fixed in ROM 103 in advance.

Additionally, while the software may be stored in FD 106 or CD-ROM 108 which are information storage media which can be handle alone and then installed from FD 106 or the like to HDD 105 or Ram 104, the software may be read directly by CPU 101 from FD 106 or the like to execute processing operations without performing such installation.

Specifically, when respective portions of data processing apparatus 100 of the present invention are realized with software, the software may be read by CPU 101 to execute corresponding operations in any way. The control program for realizing the aforementioned respective portions may be formed with a combination of a plurality of pieces of software, in which case only minimum software required to realize data processing apparatus 100 of the present invention may be stored an information storage medium which is a standalone product.

For example, when an application software is provided using an information storage medium such as CD-ROM 108 for data processing apparatus 100 in which an existing operating system is implemented, software for realizing various functions of data processing apparatus 100 of the present invention is achieved with a combination of the application software and operating system, thereby allowing elimination of software corresponding to portions dependent on the operating system from the application software in the information storage medium.

The approach for providing software described in an information storage medium to CPU 101 is not limited to direct loading of the information storage medium to data processing apparatus 100. For example, the aforementioned software can be stored in an information storage medium of a host computer which is connected to a terminal computer via a communication network to provide the software from the host computer to the terminal computer with data communication.

In the aforementioned case, while the terminal computer may execute standalone processing operations in a state where it has downloaded the software to its own information storage medium, it may execute processing operations through real-time data communication with the host computer without downloading the software. In this case, the entire system connecting the host computer to the terminal computer via the communication network corresponds to data processing apparatus 100 of the present invention.

While preferred embodiments of the present invention have been described using specific terms, such description is for illustrative purposes only, and it is to be understood that changes and variations may be made without departing from the spirit or scope of the following claims.

What is claimed is:

1. A method of designing an integrated circuit device having a transistor with a gate oxide film connected to a conductive member, said integrated circuit device having a maximum antenna size M1 of said conductive member allowed with respect to a reference area S1 of said gate oxide film, said method comprising the step of:

when a gate oxide film having an area S2 larger than said area S1 is newly designed, determining its maximum antenna size M2 such that its "M2>M1×(S2/S1)".

2. A method of designing an integrated circuit device having a transistor with a gate oxide film connected to a conductive member, said integrated circuit device having a maximum antenna size M1 of said conductive member allowed with respect to a reference area S1 of said gate oxide film, said method comprising the step of:

when a gate oxide film having an area S2 smaller than said area S1 is newly designed, determining its maximum antenna size M2 such that its "M2<M1×(S2/S1)".

3. A method of designing an integrated circuit device having a transistor with a gate oxide film connected to a conductive member, said integrated circuit device having a maximum antenna size M1 of said conductive member allowed with respect to a reference area S1 of said gate oxide film, said method comprising the step of:

designing a new gate oxide film and a new conductive member such that an area S2 of said gate oxide film and a maximum antenna size M2 of said conductive member satisfy the following equation "M2=M1×(S2/S1)$^{1/b}$", where b is a predetermined constant.

4. The method according to claim 3, wherein said constant b satisfies "0.5≦b≦0.8".

5. A method of designing an integrated circuit device having a transistor with a gate oxide film connected to a conductive member, said integrated circuit device having a maximum antenna size M1 of said conductive member allowed with respect to a reference area S1 of said gate oxide film, said method comprising the step of:

designing a new gate oxide film and a new conductive member such that an area S2 of said gate oxide film and a maximum antenna size M2 of said conductive member satisfy the following equation "M2=d×(M1/d)$^{(S2/S1)}$", where d is a predetermined constant.

6. The method according to claim 5, wherein said constant d satisfies "0.5≦d≦3.0".

7. An apparatus of designing an integrated circuit device having a transistor with a gate oxide film connected to a conductive member, comprising:

data storage means for storing a maximum antenna size M1 of said conductive member and a reference area S1 of said gate oxide film;

data input means for entering an area S2 of a new gate oxide film; and calculation means for calculating a maximum antenna size M2 of a new conductive member allowed with respect to the area S2 entered by said data input means based on the equation "M2=M1×(S2/S1)$^{1/b}$", where b is a predetermined constant.

8. An apparatus of designing an integrated circuit device having a transistor with a gate oxide film connected to a conductive member, comprising:

data storage means for storing a maximum antenna size M1 of said conductive member and a reference area S1 of said gate oxide film;

data input means for entering an area S2 of a new gate oxide film; and calculation means for calculating a maximum antenna size M2 of a new conductive member with respect to the area S2 entered by said data input means based on the equation "M2=d×(M1/d)$^{(S2/S1)}$", where d is a predetermined constant.

9. An information storage medium for storing, as software freely readable by a computer, a program for assisting in design of an integrated circuit device having a transistor with a gate oxide film connected to a conductive member, said program causing said computer to perform:

storing an allowed maximum antenna size M1 of said conductive member and a reference area S1 of said gate oxide film;

receiving data input of an area S2 of a new gate oxide film; and calculating a maximum antenna size M2 of a new conductive member with respect to the area S2 input based on the equation "M2=M1×(S2/S1)$^{1/b}$", where b is a predetermined constant.

10. An information storage medium for storing, as software freely readable by a computer, a program for assisting in design of an integrated circuit device having a transistor with a gate oxide film connected to a conductive member, said program causing said computer to perform:

storing an allowed maximum antenna size M1 of said conductive member and a reference area S1 of said gate oxide film;

receiving data input of an area S2 of a new gate oxide film; and calculating a maximum antenna size M2 of a new conductive member with respect to the area S2 input based on the equation "$M2=d\times(M1/d)^{(S2/S1)}$", where d is a predetermined constant.

11. An integrated circuit device having a transistor with a gate oxide film connected to a conductive member, said integrated circuit device having an antenna size equal to or smaller than M1 of said conductive member with respect to a reference area S1 of said gate oxide film, comprising:

a gate oxide film having an area S2 larger than said area S1; and a conductive member connected to said gate oxide film having the area S2 and having a maximum antenna size M2 falling within the range based on the equation "$M2>M1\times(S2/S1)$".

12. An integrated circuit device having a transistor with a gate oxide film connected to a conductive member, said integrated circuit device having an antenna size equal to or smaller than M1 of said conductive member with respect to a reference area S1 of said gate oxide film, comprising:

a gate oxide film having an area S2 smaller than said area S1; and a conductive member connected to said gate oxide film having the area S2 and having a maximum antenna size M2 falling within the range based on the equation "$M2>M1\times(S2/S1)$".

13. An integrated circuit device having a transistor with a gate oxide film connected to a conductive member, said integrated circuit device having an antenna size equal to or smaller than M1 of said conductive member with respect to a reference area S1 of said gate oxide film, comprising:

a gate oxide film having an area S2; and a conductive member connected to said gate oxide film having the area S2 and having an antenna size M2 falling within the range based on the equation "$M2 \leq M1\times(S2/S1)^{1/b}$", where b is a predetermined constant.

14. An integrated circuit device having a transistor with a gate oxide film connected to a conductive member, said integrated circuit device having a maximum antenna size M1 of said conductive member allowed with respect to a reference area S1 of said gate oxide film, comprising:

a gate oxide film having an area S2; and a conductive member connected to said gate oxide film having the area S2 and having an antenna size M2 falling within the range based on the equation "$M2 \leq d\times(M1/d)^{(S2/S1)}$", where d is a predetermined constant.

* * * * *